(12) United States Patent
Abughazaleh

(10) Patent No.: US 6,642,788 B1
(45) Date of Patent: Nov. 4, 2003

(54) DIFFERENTIAL CASCODE AMPLIFIER

(75) Inventor: Firas N. Abughazaleh, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/011,473

(22) Filed: Nov. 5, 2001

(51) Int. Cl.$^7$ ................................................. H03F 3/45
(52) U.S. Cl. ....................... 330/253; 330/258; 330/311; 330/136
(58) Field of Search ................................. 330/253, 258, 330/311, 136

(56) References Cited

U.S. PATENT DOCUMENTS

| | | | | |
|---|---|---|---|---|
| 4,929,909 A | * | 5/1990 | Gilbert | 330/256 |
| 5,179,354 A | * | 1/1993 | Okamoto | 330/253 |
| 6,107,882 A | * | 8/2000 | Gabara et al. | 330/253 |

FOREIGN PATENT DOCUMENTS

EP     493335     * 1/1992

OTHER PUBLICATIONS

Lampinen "An Optimization Approach to Designing OTAs for Low–Voltage Sigma–Delta Modulators" IEEE Transactions on Instrumentation and Measurement, vol. 50, No. 6 Dec. 2001.*

* cited by examiner

Primary Examiner—Michael B Shingleton
(74) Attorney, Agent, or Firm—Russell D. Slifer, Esq.; H. C. Chan; Justin Liu

(57) ABSTRACT

A differential amplifier amplifies input signals and includes first and second differential input transistor pairs. The first input pair controls output voltages by adjusting sink currents coupled to the outputs. The second pair of transistors compliments the first pair by dynamically adjusting a current sourced to the outputs. A common mode circuit has also been described that adjusts both the current sourced to the outputs and the sink currents. In one embodiment, the amplifier is fully differential and controls both current source transistors and current sink transistors coupled to the amplifiers outputs.

26 Claims, 7 Drawing Sheets

US 6,642,788 B1

DIFFERENTIAL CASCODE AMPLIFIER

FIELD OF THE INVENTION

The present invention relates generally to integrated circuits and in particular the present invention relates to cascode operational amplifiers.

BACKGROUND OF THE INVENTION

Operational Amplifiers (OP AMP) are key elements to most analog circuits. Various amplifier configurations, such as common emitter ("CE"), common base ("CB") and common collector ("CC") are available. The CE-CB configuration, usually referred to as a cascode amplifier, has basically the same input characteristics as a CE amplifier and the same output characteristics as the CB amplifier. Specifically, it has high output resistance, which is useful in achieving a large amount of voltage gain. Moreover, in this configuration, no high frequency feedback occurs from the output to the input, and an input Miller capacitance effect is at a minimum because the voltage gain of the CE configuration is very low. Therefore, the cascode configuration is inherently stable and hence ideally suited for high-frequency applications.

Referring to FIG. 1, a circuit diagram of a conventional fully differential folded cascode CMOS OP AMP is illustrated. The OP AMP 1 has two input voltage terminals (Vin+, Vin−), two output voltage terminals (Vo+, Vo−), two power supply terminals (Vdd, Vss), four DC bias voltage terminals (A, B, C, D), a common mode feed back voltage terminal (VCM), seven NMOS transistors (M1, M2, M3, M8, M9, M10, M11), and four PMOS transistors (M4, M5, M6, M7).

Increasing the bandwidth and open loop gain of an OP AMP for use in high speed switching circuits can be difficult. For the reasons stated above, and for other reasons stated below which will become apparent to those skilled in the art upon reading and understanding the present specification, there is a need in the art for fully differential folded cascode operational transconductance amplifier with enhanced gain and bandwidth.

SUMMARY OF THE INVENTION

The above-mentioned problems with amplifiers and other problems are addressed by the present invention and will be understood by reading and studying the following specification.

In one embodiment, a differential amplifier comprises differential output nodes, first and second current sources coupled to the differential output nodes, and first and second current sinks coupled to the differential output nodes. A first pair of differential input transistors are coupled to the first and second current sources to adjust output voltages on the output nodes in response to input signals. A second pair of differential input transistors are coupled to the first and second current sources to adjust currents provided by the first and second current sources in response to the input signals.

The differential amplifier can include common mode circuitry coupled to the first and second current sources to further adjust the currents provided by the first and second current sources in response to a common mode voltage of the input signals.

In another embodiment, a differential cascode amplifier comprises input connections to receive differential input signals, output connections to provide differential input signals, and first and second current sources coupled to the output connections. A first pair of differential input transistors are coupled to sink current from the first and second current sources in response to the input signals. A second pair of differential input transistors are coupled to adjust currents provided by the first and second current sources in response to the input signals.

In yet another embodiment, a differential cascode amplifier comprises first and second input connections to receive differential input signals, first and second output connections to provide differential input signals and output circuitry coupled to the first and second output connections. The output circuitry comprises a first current source transistor electrically coupled to the first output connection, a first current sink transistor electrically coupled to the first output connection, a second current source transistor electrically coupled to the second output connection, and a second current sink transistor electrically coupled to the second output connection. The amplifier further includes differential circuitry coupled to the output circuitry. The differential circuitry comprises a first input transistor electrically coupled to the first output connection, a second input transistor electrically coupled to the second output connection, and a tail current transistor coupled to the first and second input transistors. The first and second input transistors sink current from the first and second output connection through the tail current transistor in response to the input signals. A dynamic bias circuit coupled to gates of the first and second current source transistors.

A method of operating a differential amplifier circuit comprises providing source currents to first and second differential output connections in response to first and second differential input signals, and adjusting current levels of the source currents in response to the first and second differential input signals.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
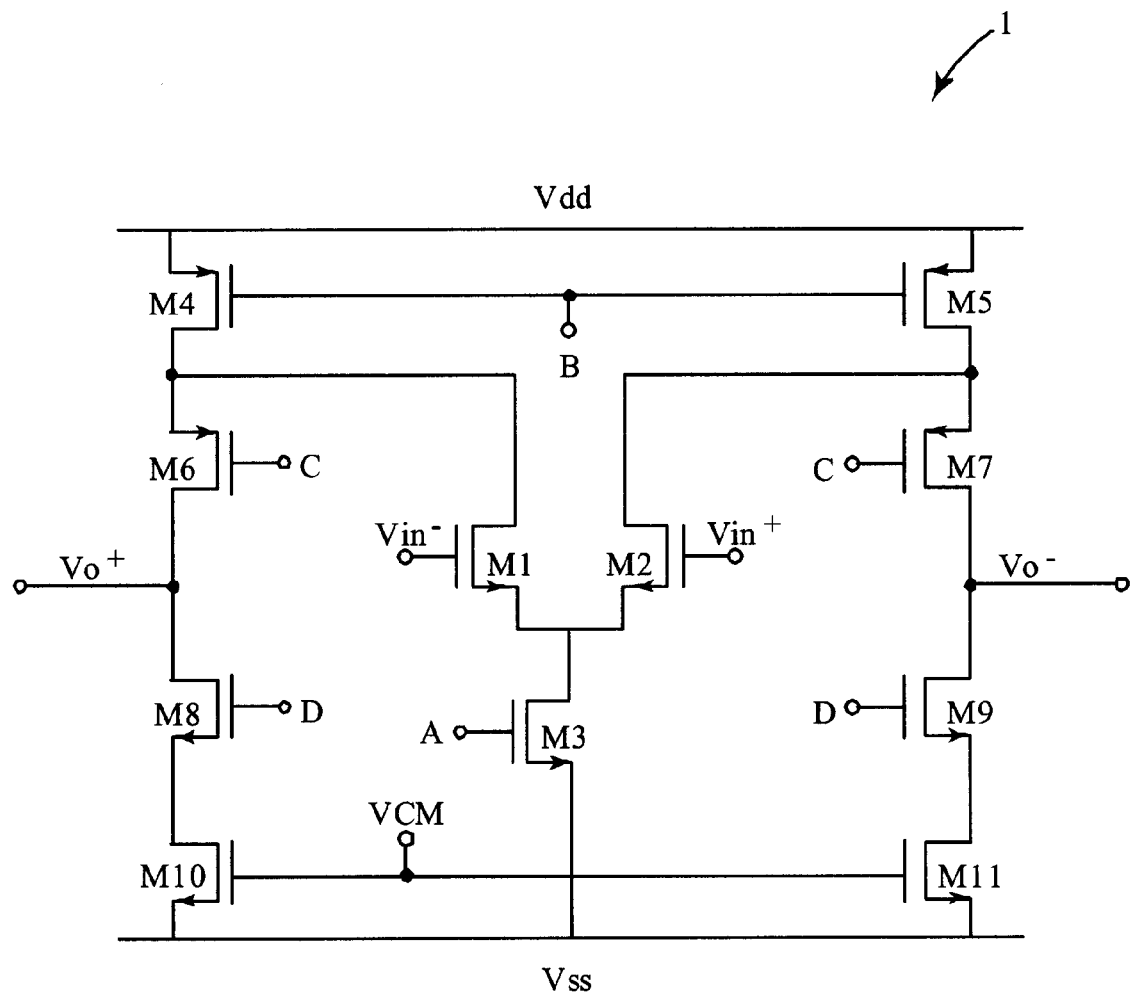
FIG. 1 is a prior art cascode amplifier.
Figure 2:
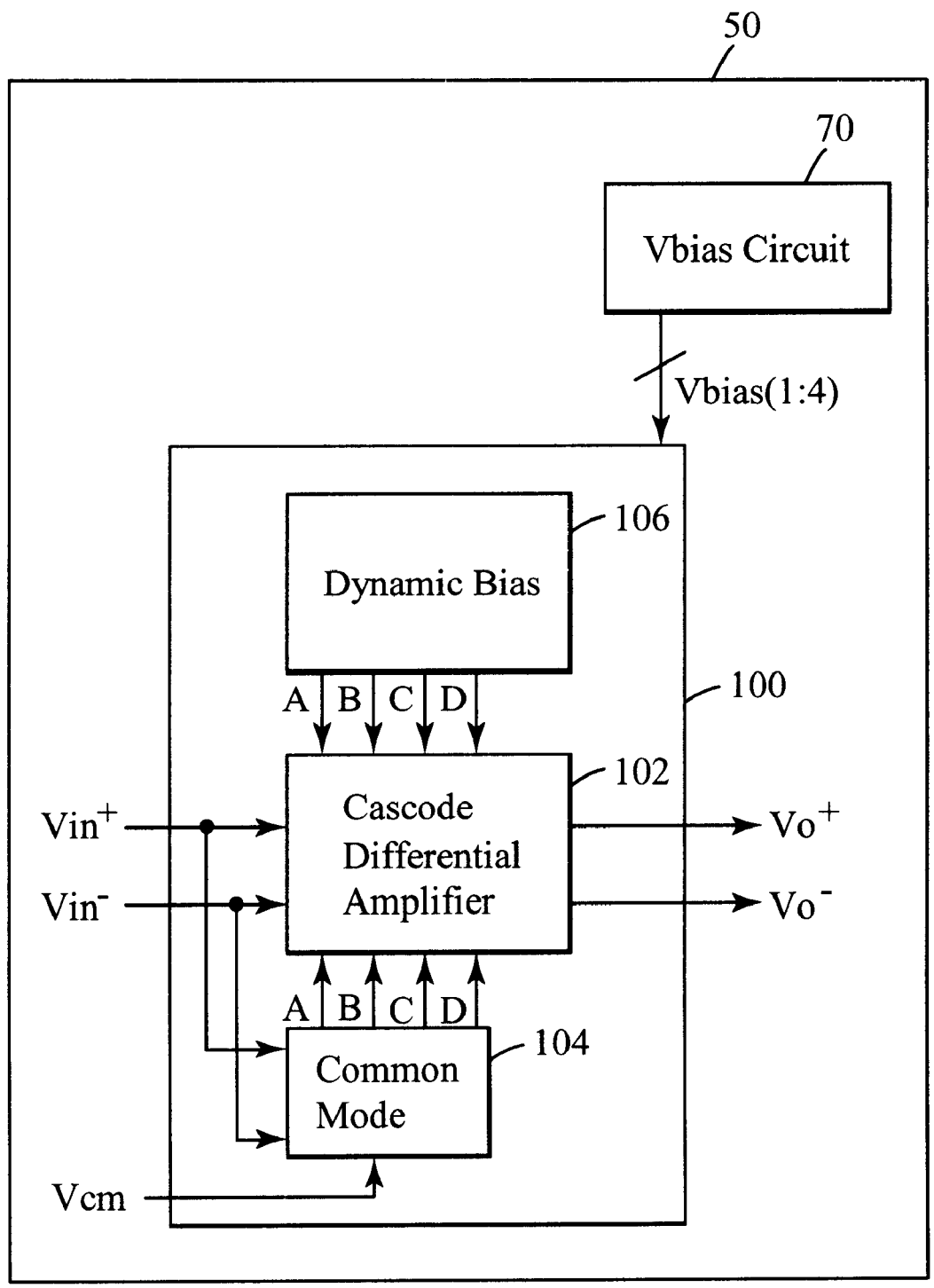
FIG. 2 is a block diagram of an integrated circuit of an embodiment of the present that includes an operational amplifier.
Figure 3:
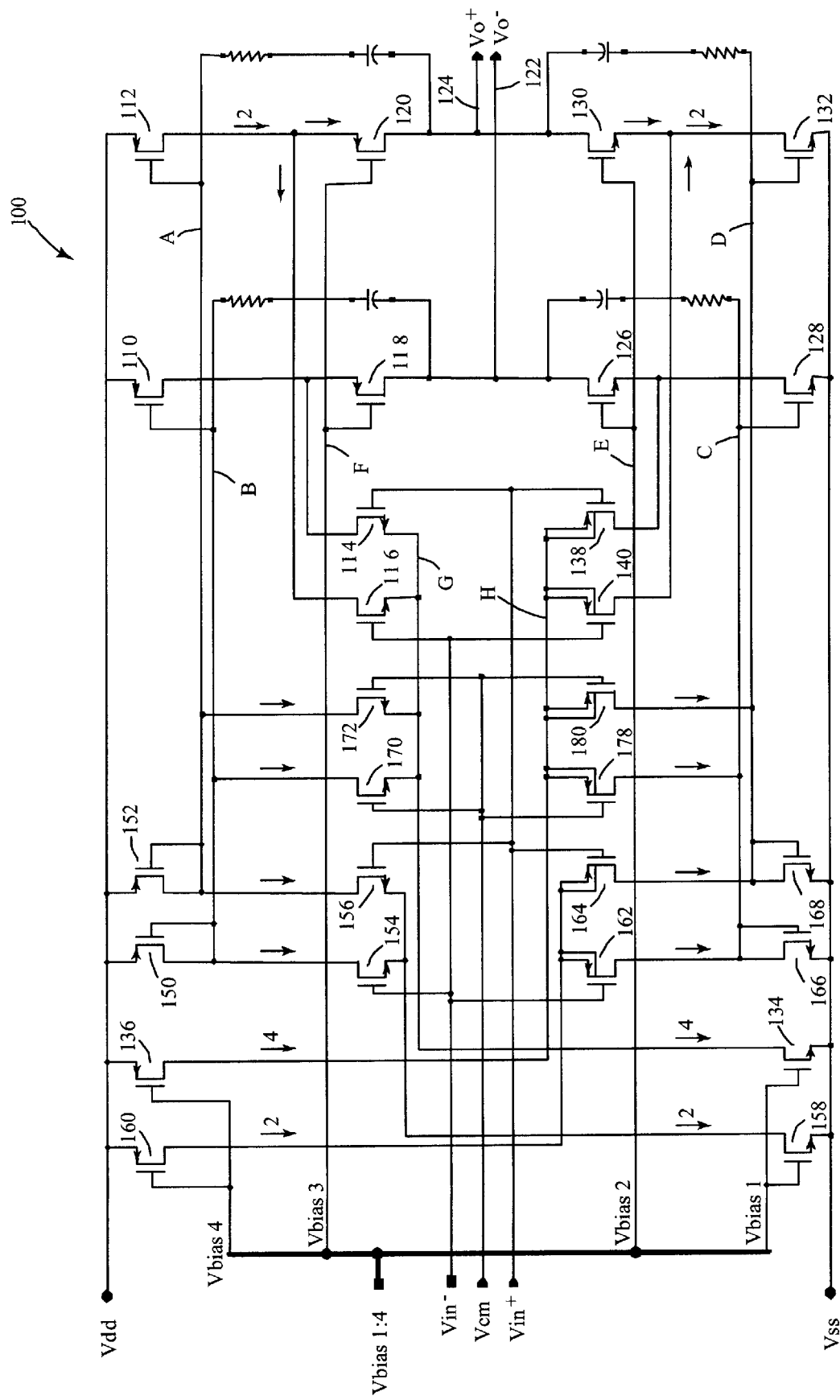
FIG. 3 is a schematic diagram of an operational amplifier of an embodiment of the present.
Figure 4:
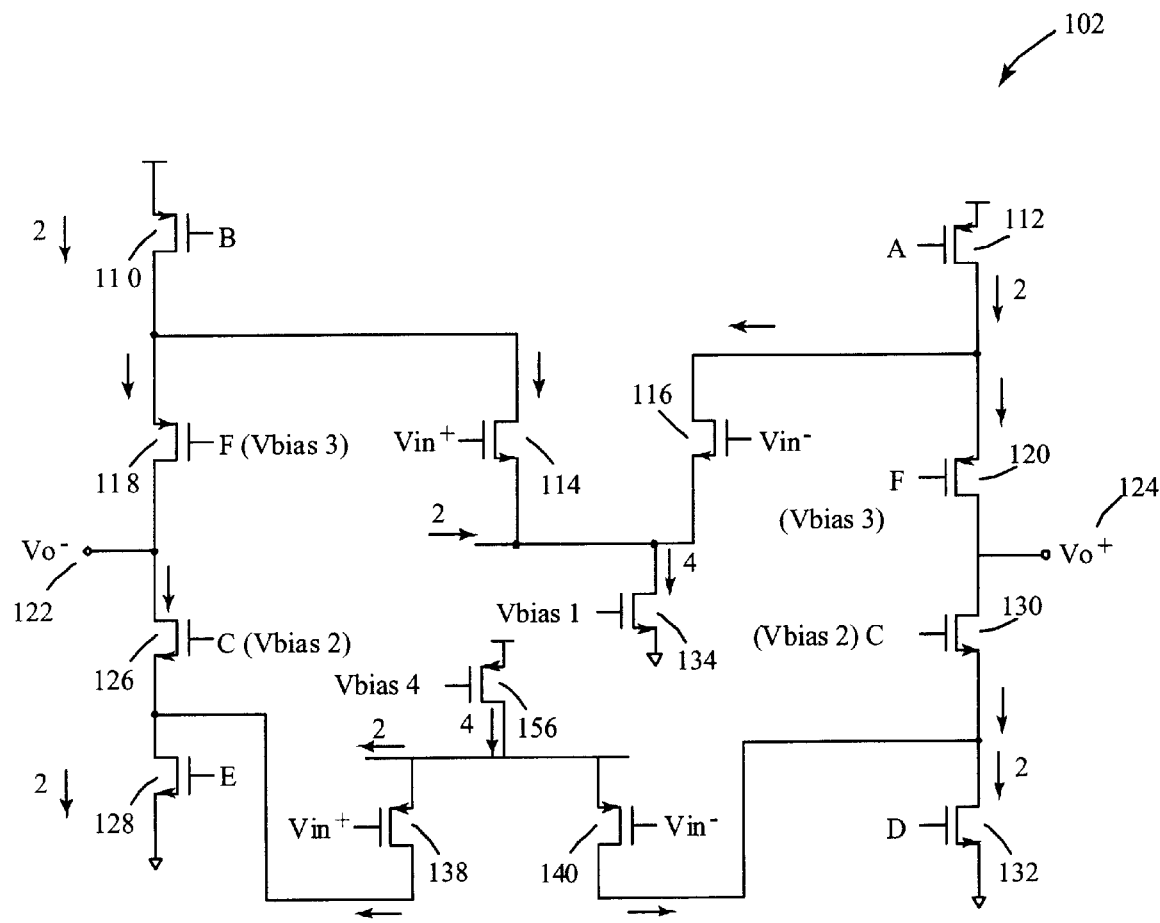
FIG. 4 is a schematic diagram of a cascode portion of the amplifier of FIG. 3.

FIG. 2 is a block diagram of an integrated circuit 50 of an embodiment of the present invention that includes an operational amplifier 100. The amplifier 100 has three primary components; a folded cascode differential circuit 102, common mode control circuitry 104, and a dynamic bias circuit 106. A common mode voltage reference Vcm is provided externally. The Vcm reference is used to adjust common mode circuitry 104, as explained below. A Vbias circuit 70 provides bias voltages, Vbias 1:4, to the differential amplifier 102. The common mode circuitry 104 and a dynamic bias circuit 106 each adjust voltage signal A, B, C and D to adjust source and sink currents of the amplifier, also explained below.

Referring to FIGS. 3–6, an embodiment of amplifier 100 of the present invention is described. Folded cascode differential circuitry 102 includes cascode current sources 110 and 112, and cascode current sinks 128 and 132, see FIG. 4 for an isolated circuit schematic. The currents conducted by these four transistors help establish a differential voltage between output nodes 122 and 124. As explained below, the currents conducted by transistors 110, 112, 128 and 132 are controlled by input transistors, common mode circuitry 104, and dynamic bias circuit 106. Two pair of input transistors 114 and 116, and 138 and 140 convert the input signals (Vin+ and Vin−) to currents. The first pair of input transistors 114 and 116 partially control the current conducted through the top set of cascode amplifier transistors 118 and 120. The second pair of input transistors 138 and 140 partially control the current conducted through the bottom set of cascode amplifier transistors 126 and 130. Cascode transistors 118 and 120 are respectively coupled between outputs 122 and 124 and current sources 110 and 112. Likewise, cascode transistors 126 and 130 are respectively coupled between outputs 122 and 124 and current sinks 128 and 132. The cascode transistors are biased using circuit 70 and the Vbiasθ 1:4 signals. During operation, the cascode transistors are activated.

In operation, if the Vin− signal is reduced relative to Vin+, the current through transistor 120/126 is increased and the current through 130/118 is decreased. Thus, the voltage on output node 124 is increased and the voltage decreases on output node 122. Conversely, if the Vin− signal is increased relative to Vin+, the current through transistor 120/126 is decreased and the current through 130/118 is increased. Thus, the voltage on output node 124 is decreased and the voltage increases on output node 122.

The currents conducted through source transistors 110 and 112 are also controlled by dynamically adjusting the bias voltage provided on the gate connections (A and B) of transistors 110 and 112. This is accomplished using transconductance transistors 150 and 152 coupled to a second pair of input differential transistors 154 and 156, see FIG. 5. The differential transistor pair is coupled to enhance transistor pair 114 and 116. That is, transistors 154 and 156 either increase or decrease the gate voltages of source transistors 110 and 112 to change the current sourced to the cascode transistors 118 and 120. For example, if the Vin− signal is reduced relative to Vin+, the current through transistor 156 is increased and the gate voltage of transistor 112 is decreased. As such, the current in transistor 120 is increased and the voltage on node 124 is increased and the voltage on node 122 is decreased.

Figure 6:
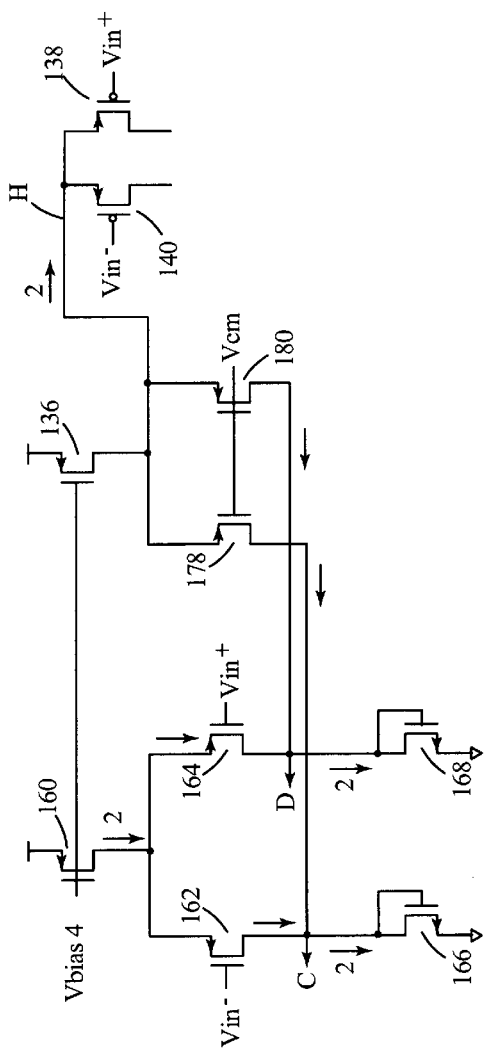
FIG. 6 is a schematic diagram of a remaining dynamic bias circuitry and common mode circuitry of the amplifier of FIG. 3.

The currents conducted through sinking transistors 128 and 132 are also controlled by dynamically adjusting the bias voltage provided on the gate connections (C and D) of transistors 128 and 132, see FIG. 6. This is accomplished using transconductance transistors 166 and 168 coupled to differential transistors 162 and 164. The differential transistor pair is coupled to enhance the transistor pair 138 and 140 by changing the pull-down current. That is, transistors 166 and 168 either increase or decrease the gate voltages of sink transistors 128 and 132. For example, if the Vin− signal is reduced relative to Vin+, the current through transistor 162 is increased and the gate voltage of transistor 128 is increased. As such, the current in transistor 126 is increased and the voltage on node 122 is decreased and the voltage on node 124 is increased.

Figure 5:
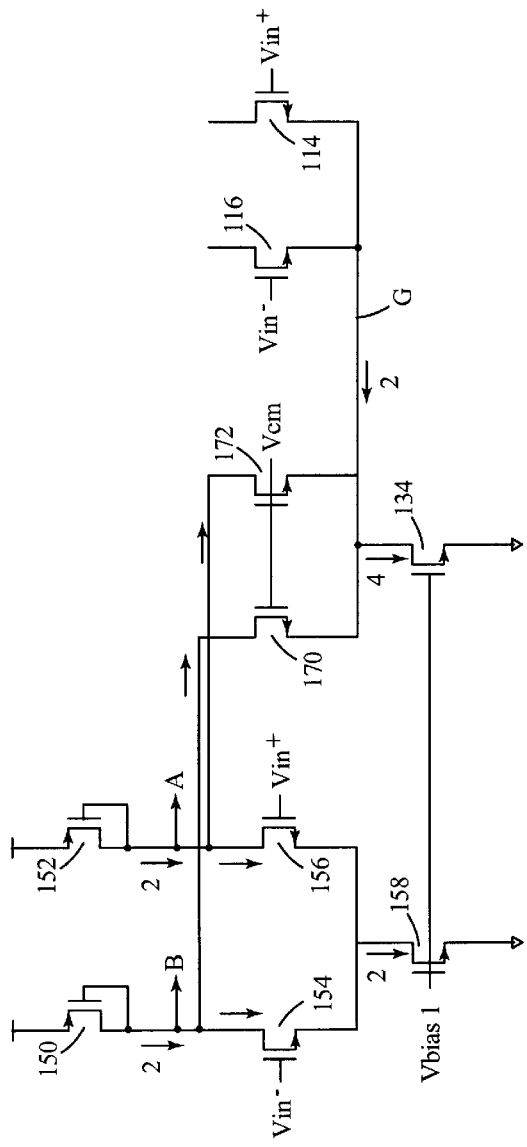
FIG. 5 is a schematic diagram of a portion of dynamic bias circuitry and common mode circuitry of the amplifier of FIG. 3.

Common mode circuitry 104 is provided to adjust the amplifier's output common mode level in response to an input common mode reference voltage (Vcm). Referring to FIG. 5, common mode circuitry 104 includes transistors 170 and 172 that are coupled between nodes A and B (gates of transistors 110 and 112) and tail current transistor 134 at node G. Circuit 104 also includes the input differential pair transistors 114 and 116 that are coupled between the drain nodes of transistors 110 and 112 and the tail current transistor 134 at node G. The Vcm reference controls the gates of transistors 170 and 172. The amplifier's output common mode signal is monitored by the differential input transistor pair 114 and 116 by means of a feedback network 60 shown in FIG. 7. The common mode of the input signal is also monitored by the input differential transistor pair 114 and 116 by means of an input network 80 shown in FIG. 7. When the output common mode signal increases above the level of Vcm through uncontrolled means, the input common mode signal increases. The increase in the input common mode voltage causes an increase in the currents of transistors 114 and 116. The increase in the currents of transistors 114 and 116 causes a decrease in the currents of the cascode transistors 118 and 120 causing a decrease in the voltage at output nodes 122 and 124. The decreasing of the output voltage of 122 and 124 negates the original increase and adjusts the output common mode voltage value back to the value of Vcm. Moreover, the increase in the currents of transistors 114 and 116 causes the current in transistors 170 and 172 to decrease by sourcing more current to transistor 134. The decrease in the currents of transistors 170 and 172 causes an increase in the gate voltage of transistors 110 and 112 causing their currents to decrease. The decrease in the currents of transistors 110 and 112 causes an additional decrease in the currents of the cascode transistors 118 and 120 causing an additional decrease in the voltage at output nodes 122 and 124. The decreasing of the output voltage of 122 and 124 negates the original increase and adjusts the output common mode voltage value back to the value of Vcm. The common mode circuit, therefore, controls the common mode of the output signals by adjusting the sourced current and the differential transistors 114 and 116.

Common mode circuitry 104 also adjusts the pull-down portion of the amplifier, see FIG. 6. Common mode circuitry 104 includes transistors 178 and 180 that are coupled between nodes D and C (gates of transistors 128 and 132) and tail current transistor 136 at node H. Circuit 104 also includes the input differential pair transistors 138 and 140 that are coupled between the drain nodes of transistors 128 and 132 and the tail current transistor 136 at node H. The Vcm reference controls the gates of transistors 178 and 180. The amplifiers output common mode signal is monitored by the differential input transistor pair 138 and 140 by means of a feedback network 60 shown in FIG. 7. The common mode of the input signal is also monitored by the input differential transistor pair 138 and 140 by means of an input network 80 shown in FIG. 7. When the output common mode signal increases above the level of Vcm through uncontrolled means, the input common mode signal increases. The increase in the input common mode voltage causes a decrease in the currents of transistors 138 and 140. The decrease in the currents of transistors 138 and 140 causes an increase in the currents of the cascode transistors 126 and 130 causing a decrease in the voltage at output nodes 122 and 124. The decreasing of the output voltage of 122 and 124 negates the original increase and adjusts the output common mode voltage value back to the value of Vcm. Moreover, the decrease in the currents of transistors 138 and 140 causes the current in transistors 178 and 180 to increase by sinking less current from transistor 136. The increase in the currents of transistors 178 and 180 causes an increase in the gate voltage of transistors 128 and 132 causing their currents to increase. The increase in the currents of transistors 128 and 132 causes an additional increase in the currents of the cascode transistors 126 and 130 causing an additional decrease in the voltage at output nodes 122 and 124. The decreasing of the output voltage of 122 and 124 negates the original increase and adjusts the output common mode voltage value back to the value of Vcm. The common mode circuit, therefore, controls the common mode of the output signals by adjusting the sink current and the differential transistors 138 and 140.

Figure 7:
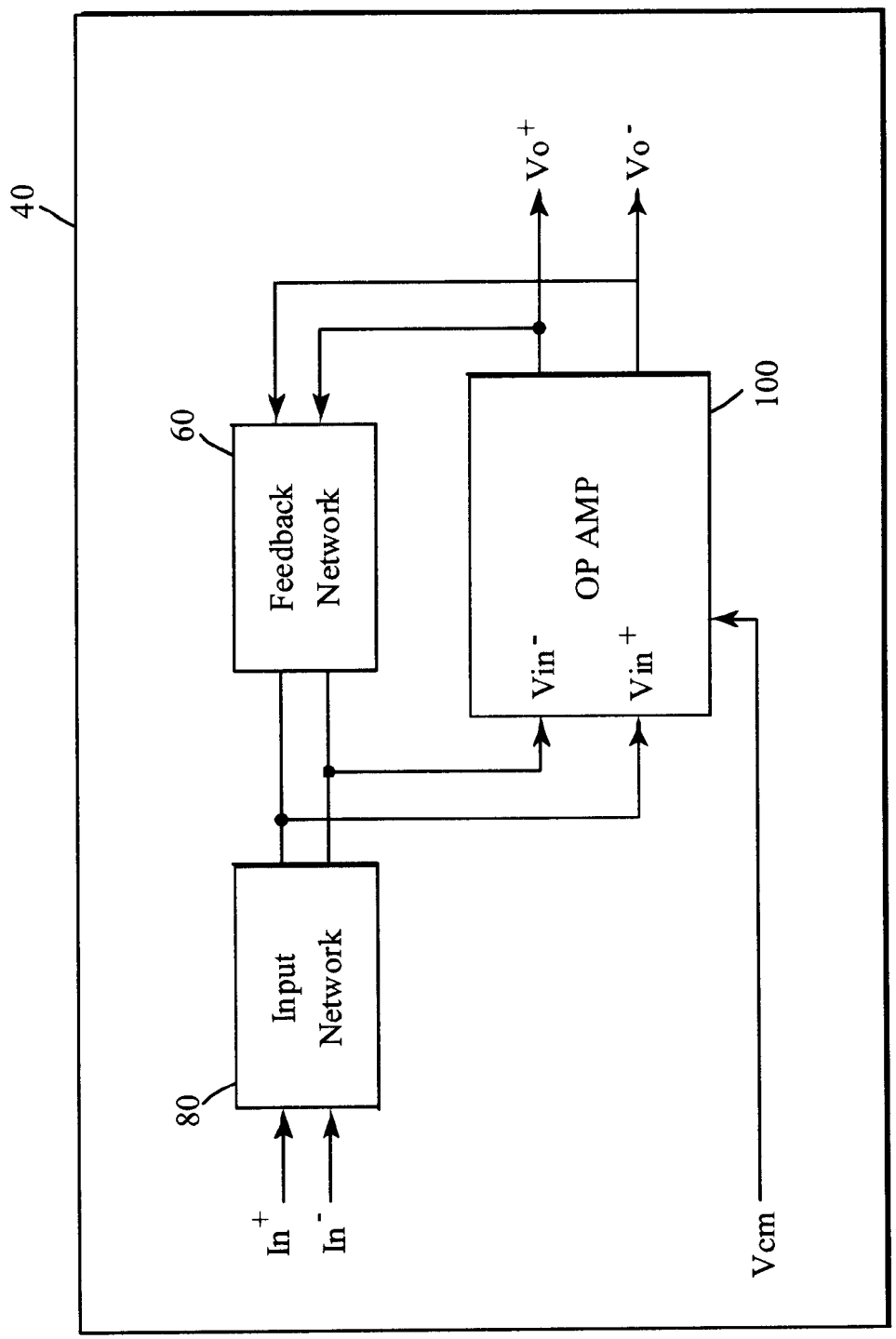
FIG. 7 is a depiction of an amplifier of an embodiment of the present invention.
Figure 8:
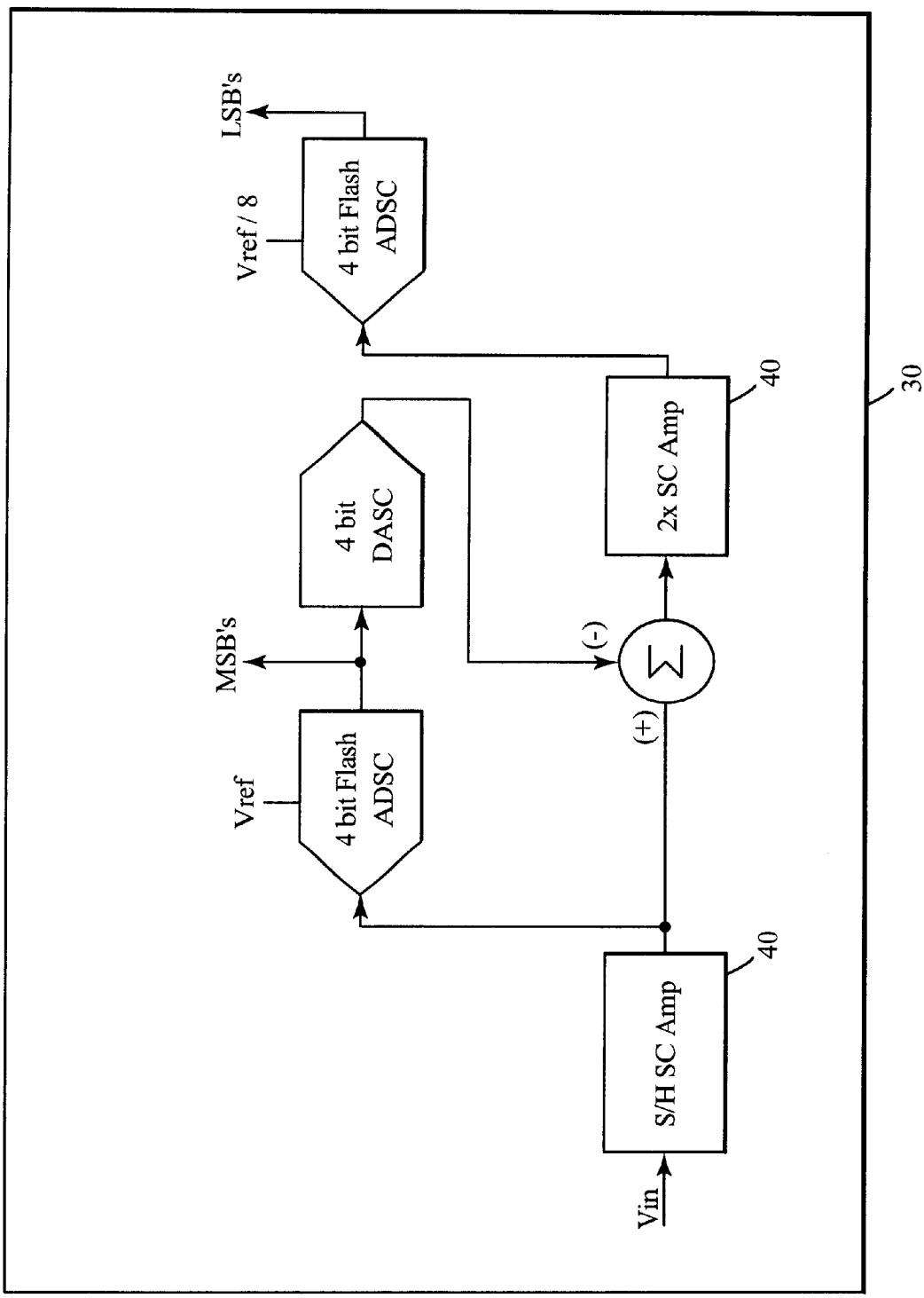
FIG. 8 is a block diagram of a high speed Analog to digital Converter (ADC) where the present amplifier is utilized.

Referring to FIG. 7, circuit 40 is a general depiction of an operational amplifier 100 (opamp) configured with a feedback (FB) network 60 and an input network 80. Most opamps require some form of a feedback network, and one common implementation of such a FB network in CMOS IC's is the use of Switched Capacitors (SC). This allows sampling of the analog signal during a period of time defined by a first phase of a clock signal. The analog signal is then held for another period of time defined by clock phase two. This principle is useful when designing an analog-to-digital circuit (ADC) as shown in FIG. 8. Amplifier 40 of FIG. 7 is used in FIG. 8 as a Sample-and-Hold (S/H) amplifier to capture the analog input signal and hold it for a period of time while the rest of the ADC processes an analog sample. In another implementation, amplifier 40 is used inside the ADC as a summation and as a multiply-by-two function labeled as "2×SC Amp". FIG. 8 illustrates the value of an opamp of the present invention and how it is used to implement other more complex functions. The value of the high speed operations allows the opamp to process more samples per second thus facilitating the implementation of high speed ADC'S.

CONCLUSION

A differential amplifier has been described that amplifies input signals. The amplifier includes first and second differential input transistor pairs. The first input pair controls output voltages by adjusting sink currents coupled to the outputs. The second pair of transistors compliments the first pair by adjusting a current sourced to the outputs. A common mode circuit has also been described that adjusts both the current sourced to the outputs and the sink currents. In one embodiment, the amplifier is fully differential and controls both current source transistors and current sink transistors coupled to the amplifiers outputs.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

I claim:

1. A differential amplifier comprising:

differential output nodes;

first and second current sources coupled to the differential output nodes;

first and second current sinks coupled to the differential output nodes for sinking current from the differential output nodes;

a first pair of differential input transistors coupled to the first and second current sources to adjust output voltages on the output nodes in response to input signals; and a second pair of differential input transistors coupled to the first and second current sources to adjust currents provided by the first and second current sources in response to the input signals.

2. The differential amplifier of claim 1 further comprising:

a third pair of differential input transistors coupled to the first and second current sinks to adjust the output voltages on the output nodes in response to the input signals; and a fourth pair of differential input transistors coupled to the first and second current sinks to adjust their currents in response to the input signals.

3. The differential amplifier of claim 1 further comprising:

common mode circuitry coupled to the first and second current sources to further adjust the currents provided by the first and second current sources in response to a common mode voltage signal.

4. The differential amplifier of claim 3 wherein the common mode circuitry is coupled to adjust currents conducted by the first pair of differential input transistors.

5. The differential amplifier of claim 3 wherein the common mode circuitry is coupled to the first and second current sinks to further adjust the currents provided by the first and second current sources in response to the input signals.

6. The differential amplifier of claim 5 wherein the common mode circuitry is coupled to adjust currents conducted by the third pair of differential input transistors.

7. A differential cascode amplifier comprising:

input connections to receive differential input signals;

output connections to provide differential output signals;

first and second current sources coupled to the output connections;

a first pair of differential input transistors coupled to sink a portion of currents provided by the first and second current sources in response to the input signals; and a second pair of differential input transistors coupled to adjust currents provided by the first and second current sources in response to the input signals.

8. The differential cascode amplifier of claim 7 wherein the first pair of differential input transistors comprises:

a first transistor coupled between the first current source and a tail current transistor, the first transistor has a gate coupled to receive a first input signal; and a second transistor coupled between the second current source and the tail current transistor, the second transistor has a gate coupled to receive a second input signal.

9. The differential cascode amplifier of claim 8 further comprising:

common mode circuitry coupled to further adjust the currents provided by the first and second current sources in response to a common mode voltage signal, wherein the common mode circuitry is coupled to distribute a current conducted by the tail current transistor.

10. The differential cascode amplifier of claim 7 further comprising:
    first and second current sinks coupled to the output connections;
    a third pair of differential input transistors coupled to source current to the first and second current sinks in response to the input signals; and
    a fourth pair of differential input transistors coupled to adjust currents sunk by the first and second current sinks in response to the input signals.

11. The differential cascode amplifier of claim 10 wherein the third pair of differential input transistors comprises:
    a third transistor coupled between the first current sink and a source current transistor, the third transistor has a gate coupled to receive a first input signal; and
    a fourth transistor coupled between the second current sink and the source current transistor, the fourth transistor has a gate coupled to receive a second input signal.

12. The differential cascode amplifier of claim 11 further comprising:
    common mode circuitry coupled to further adjust the currents sunk by the first and second current sinks in response to a common mode voltage signal, wherein the common mode circuitry is coupled to distribute a current provided by the source current transistor.

13. A differential cascode amplifier comprising:
    input connections to receive differential input signals;
    output connections to provide differential output signals;
    a first differential circuit coupled to adjust the differential output signals in response to the input signals;
    a second differential circuit coupled to adjust source currents electrically coupled to the output connections in response to the input signals; and
    common mode circuitry to adjust a combined current sink of the first differential circuit in response to a common mode voltage of the input signals.

14. A differential cascode amplifier comprising:
    first and second input connections to receive differential input signals;
    first and second output connections to provide differential output signals;
    output circuitry coupled to the first and second output connections and comprising,
        a first current source transistor electrically coupled to the first output connection,
        a first current sink transistor electrically coupled to the first output connection,
        a second current source transistor electrically coupled to the second output connection, and
        a second current sink transistor electrically coupled to the second output connection; differential circuitry coupled to the output circuitry and comprising,
        a first input transistor electrically coupled to the first output connection,
        a second input transistor electrically coupled to the second output connection, and
        a tail current transistor coupled to the first and second input transistors, wherein the first and second input transistors sink current from the first and second current source transistors through the tail current transistor in response to the input signals; and
    a dynamic bias circuit coupled to gates of the first and second current source transistors.

15. The differential cascode amplifier of claim 14 wherein the dynamic bias circuit comprises a pair of differential transistors coupled to the first and second input connections.

16. The differential cascode amplifier of claim 15 wherein the dynamic bias circuit further comprises a second pair of differential transistors coupled to gates of the first and second current sink transistors.

17. The differential cascode amplifier of claim 14 further comprising a common mode circuit, wherein the common mode circuit is coupled to the gates of the first and second current source transistors, and to the tail current transistor.

18. The differential cascode amplifier of claim 14 wherein the differential circuitry further comprises:
    a third input transistor electrically coupled to the first output connection,
    a fourth input transistor electrically coupled to the second output connection, and
    a source current transistor coupled to the third and fourth input transistors, wherein the third and fourth input transistors source current to the first and second current sink transistors through the source current transistor in response to the input signals.

19. The differential cascode amplifier of claim 14 further comprising a common mode circuit, wherein the common mode circuit is coupled to the gates of the first and second current sink transistors, and to the source current transistor.

20. A method of operating a differential amplifier circuit comprising:
    providing source currents to first and second differential output connections in response to first and second differential input signals;
    adjusting current levels of the source currents in response to the first and second differential input signals and
    partially steering the source currents in response to the first and second differential input signals.

21. The method of claim 20 further comprises adjusting a common mode voltage on the first and second differential output connections.

22. The method of claim 20 wherein providing the source currents comprises controlling first and second current sources using first differential input transistors.

23. The method of claim 22 wherein the first and second current sources are transistors and adjusting the current levels of the source currents comprises adjusting a gate voltage of the transistors.

24. The method of claim 23 wherein the gate voltages of the transistors are adjusted in response to second differential input transistors.

25. A method of dynamically adjusting a differential cascode amplifier comprising:
    controlling differential output voltages on output connections in response to differential input voltages using a first pair of differential transistors, wherein the first pair of differential input transistors control current sink paths for sinking a portion of currents provided by current sources coupled to the output connections; and
    dynamically adjusting the current sources in response to a second pair of differential input transistors.

26. The method of claim 25 further comprises adjusting the current sink paths from the output connections and the current sources to change a common mode of the output voltages.

* * * * *